(12) United States Patent
Liu et al.

(10) Patent No.: US 9,881,949 B2
(45) Date of Patent: Jan. 30, 2018

(54) SENSING DEVICE, IMAGE SENSING SYSTEM AND METHOD THEREOF

(71) Applicant: TAIWAN SEMICONDUCTOR MANUFACTURING COMPANY LTD., Hsinchu (TW)

(72) Inventors: Chih-Min Liu, Hsinchu County (TW); Manoj M. Mhala, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 171 days.

(21) Appl. No.: 14/741,860

(22) Filed: Jun. 17, 2015

(65) Prior Publication Data

US 2016/0370224 A1 Dec. 22, 2016

(51) Int. Cl.
*H01L 27/14* (2006.01)
*H01L 27/146* (2006.01)
*H04N 5/357* (2011.01)

(52) U.S. Cl.
CPC ....... *H01L 27/14601* (2013.01); *H04N 5/357* (2013.01)

(58) Field of Classification Search
CPC .. H04N 5/357; H04N 5/3745; G01J 2001/444
See application file for complete search history.

(56) References Cited

U.S. PATENT DOCUMENTS

2014/0022430 A1* 1/2014 Ueno ................. H04N 5/37455
348/308

* cited by examiner

*Primary Examiner* — Tony Ko
(74) *Attorney, Agent, or Firm* — WPAT, P.C., Intellectual Property Attorneys; Anthony King

(57) ABSTRACT

A sensing device includes: a sampling circuit arranged to sample a sensing signal for generating a signal in response to a sampling signal having a monotonically increasing waveform; and a conversion circuit arranged to convert the signal into a digital output signal when the signal reaches a predetermined threshold of the conversion circuit.

20 Claims, 8 Drawing Sheets

SENSING DEVICE, IMAGE SENSING SYSTEM AND METHOD THEREOF

BACKGROUND

The present invention relates to an image sensing system and method thereof, and more particularly to a low Random Telegraph Signal (RTS) noise image sensor and method thereof.

A Charge-coupled Device (CCD) or a complementary metal-oxide-semiconductor (CMOS) image sensor (CIS) has been commonly used in an image capturing device, such as a camera. In comparison to CCD sensors, CIS sensors have faster readout, more functions, and a smaller system size. However, CIS sensors may suffer from noise induced by Random Telegraph Signals (RTS). RTS noise is caused by charges trapped in the gate-oxide region of a field-oxide transistor. RTS noise has become an issue for low light level applications, especially in downscaling transistor dimensions. For example, RTS noise can greatly affect the image quality of the camera. Apart from the RTS noise, in some existing methods, a circuit used for reading the signal of CIS sensors occupies a relatively large area and consumes way too much power from the camera due to the high resolution of CIS pixels and high-speed imaging requirements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
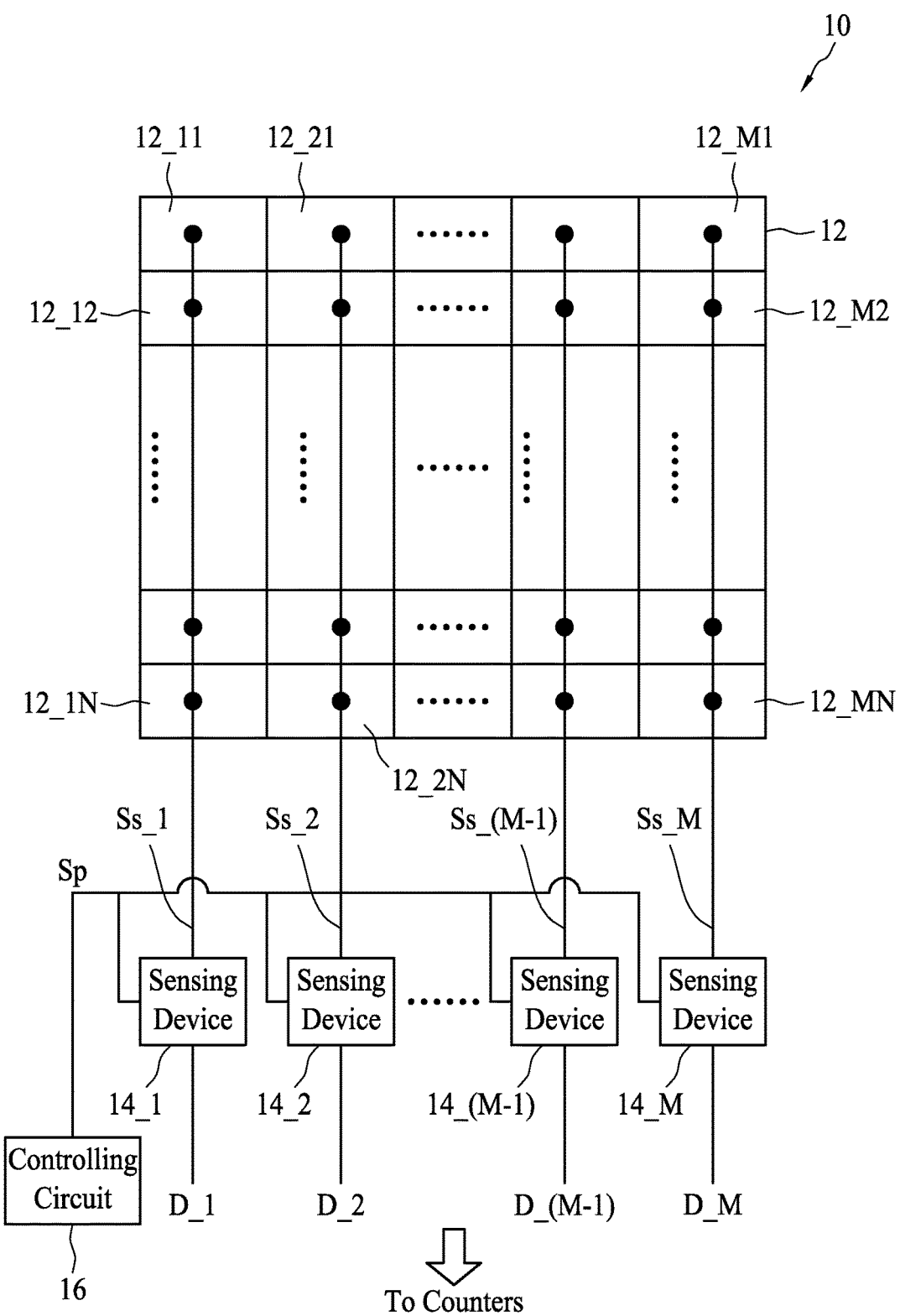
FIG. 1 is an image sensing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an image sensing system 10 in accordance with some embodiments. The image sensing system 10 comprises a sensor array 12, a plurality of sensing devices 14_1-14_M, and a controlling circuit 16. The sensor array 12 comprises a plurality of photoelectric units 12_MN arranged in a matrix pattern with M columns and N rows, M and N being natural numbers. Each of the plurality of sensing devices 14_1-14_M is coupled to a predetermined number of the plurality of photoelectric units 12_MN. The plurality of sensing devices 14_1-14_M can be regarded as the column circuits of the sensor array 12. In some embodiments, the predetermined number is N, hence the N photoelectric units of a column in the sensor array 12. In other words, each of the plurality of sensing devices 14_1-14_M is coupled to the photoelectric units of each column in the sensor array 12. For example, the sensing device 14_1 is coupled to the plurality of photoelectric units 12_11-12_1N of the first column. This is not a limitation of the embodiments. In another embodiment, a sensing device may be arranged to couple to the plurality of photoelectric units of a row in the sensor array 12. Moreover, M and N can be any integer numbers larger than 1. For example, M is 640 and N is 480, in some embodiments.

During the image sensing operation of the image sensing system 10, the plurality of photoelectric units 12_MN is arranged to generate a plurality of sensing signals. The plurality of sensing devices 14_1-14_M is arranged in a manner to row-by-row scan the sensor array 12 for sampling the sensing signals. For example, the plurality of sensing devices 14_1-14_M is arranged to sample the sensing signals generated by the plurality of photoelectric units 12_11-12_M1 of the first row, and then to sample the sensing signals generated by plurality of photoelectric units 12_12-12_M2 of the second row, and so on. However, this is not a limitation of the embodiments. The plurality of sensing devices 14_1-14_M may be arranged to sample the sensing signals by a predetermined row selection order, for example.

A control device (not shown) may be used to control the row selection order of the sensor array 12. When a row of the sensor array 12 is selected, the plurality of photoelectric units of the selected row generates a plurality of sensing signals Ss_1-Ss_M, respectively. The plurality of sensing signals Ss_1-Ss_M is received by the plurality of sensing devices 14_1-14_M coupled to the sensor array 12. In some embodiments, the photoelectric units in the non-selected rows of the sensor array 12 are turned off such that the plurality of sensing signals Ss_1-Ss_M of the selected row is not interfered with the signal of the non-selected rows. The controlling circuit 16 is coupled to the plurality of sensing devices 14_1-14_M for generating a sampling signal Sp to the plurality of sensing devices 14_1-14_M. According to some embodiments, the sampling signal Sp has a monotonically increasing waveform. For example, the monotonically increasing waveform may be a ramp-up waveform (i.e. a ramp waveform with a positive-slope) or an increasing step waveform. The plurality of sensing devices 14_1-14_M uses the sampling signal Sp to sample the plurality of sensing signals Ss_1-Ss_M for generating a plurality of digital output signals D_1-D_M, respectively. In other words, the plurality of sensing devices 14_1-14_M uses the same sampling signal Sp to sample the plurality of sensing signals Ss_1-Ss_M, respectively. In addition, a plurality of counters (not shown) is coupled to the plurality of sensing devices 14_1-14_M for counting the plurality of digital output signals D_1-D_M, respectively.

Figure 2:
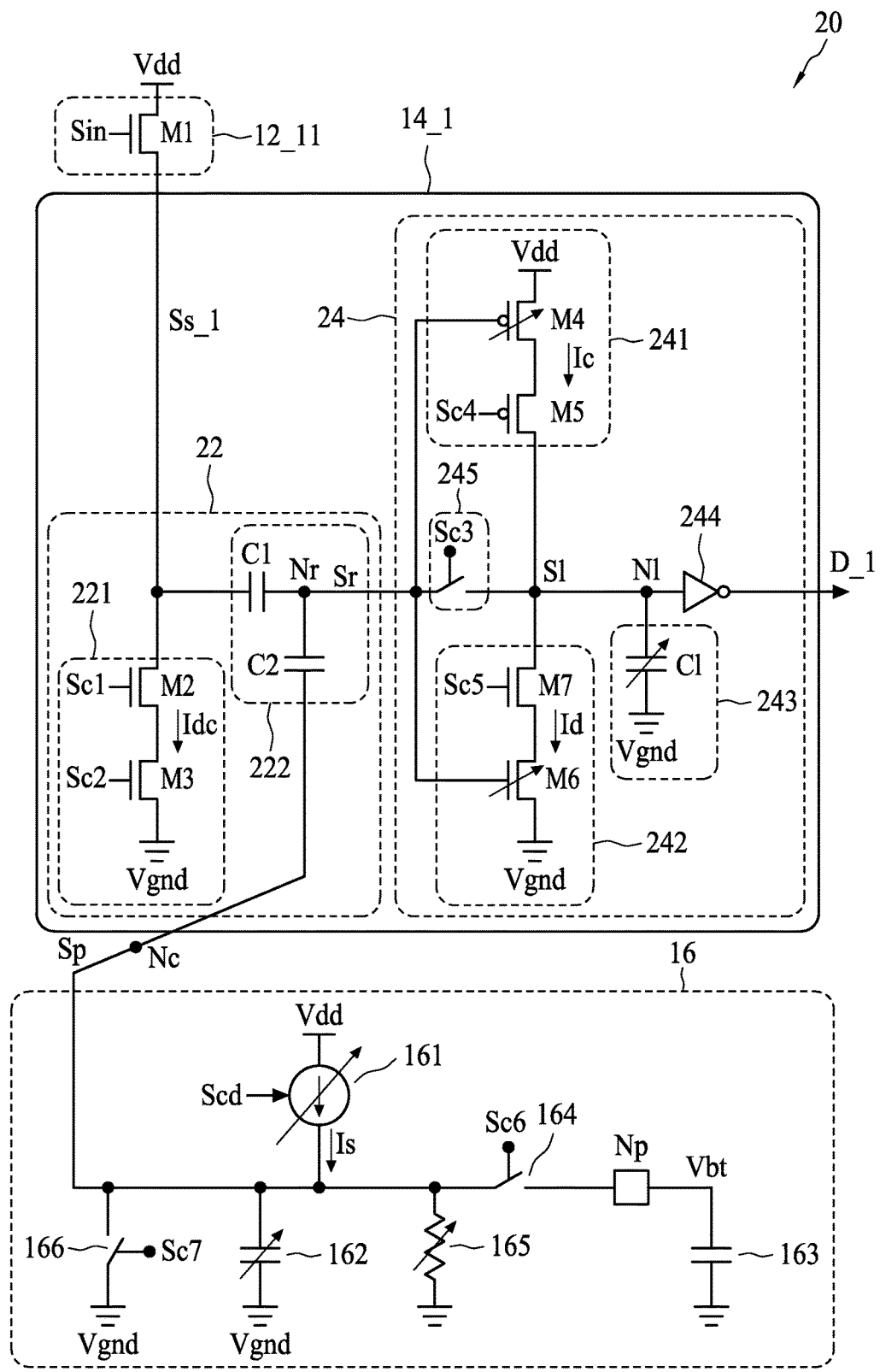
FIG. 2 is a diagram illustrating a set of more detailed circuits of the image sensing system in FIG. 1 in accordance with some embodiments.

The detailed operation of the image sensing system 10 can be referred to in FIG. 2, which is a diagram illustrating a set of more detailed circuits of the image sensing system 10 in accordance with some embodiments. For illustration, the sensing device 20 in FIG. 2 is shown to comprise the photoelectric unit 12_11, the sensing device 14_1, and the controlling circuit 16. Since other sensing devices 14_2-14_M have the similar operation, detailed description is omitted here for brevity.

According to some embodiments, the photoelectric unit 12_11 is illustrated as an N-channel field-effect transistor M1. The transistor M1 is configured as a source follower. Specifically, a drain terminal of the transistor M1 is coupled to a reference voltage, i.e., the supply voltage Vdd, a gate terminal of the transistor M1 receives an incoming signal Sin corresponding to an incident light detected by a photodiode (not shown), and a source terminal of the transistor M1 outputs the sensing signal Ss_1 in response to the incoming signal Sin. The photoelectric unit 12_11 may further comprise other circuits for converting incident light into the sensing signal Ss_1, and the other circuits are omitted here for brevity. The sensing signal Ss_1 can be regarded as a pixel signal on a column line of the sensor array 12.

The sensing device 14_1 comprises a sampling circuit 22 and a conversion circuit 24. The sampling circuit 22 is arranged to sample the sensing signal Ss_1 for generating a signal Sr in response to the sampling signal Sp. The conversion circuit 24 is arranged to convert the signal Sr into the digital output signal D_1 when the magnitude of the signal Sr reaches a predetermined threshold Vpre of the conversion circuit 24. According to some embodiments, the conversion circuit 24 may include an inverter, and the predetermined threshold Vpre is the threshold voltage of the inverter. As the threshold voltage of the inverter is at a particular voltage level, the flip point of the conversion circuit 24 follows accordingly. As a result, the predetermined threshold Vpre is not dependent on the sensing signal Ss_1.

According to some embodiments, the sampling circuit 22 comprises a biasing circuit 221 and a dividing circuit 222. The biasing circuit 221 is arranged to provide a biasing current Idc for the sensing signal Ss_1. The dividing circuit 222, coupled to the biasing circuit 221, divides a voltage difference between the sensing signal Ss_1 and the sampling signal Sp and then generates the signal Sr.

The biasing circuit 221 comprises an N-channel field-effect transistor M2 and an N-channel field-effect transistor M3. The transistor M2 has a control terminal (e.g. the gate terminal) for receiving a control signal Sc1, and a terminal (e.g. the drain terminal) for receiving the sensing signal Ss_1. The transistor M3 has a control terminal (e.g. the gate terminal) for receiving a control signal Sc2, a terminal (e.g. the drain terminal) coupled to a terminal (e.g. the source terminal) of the transistor M2, and a terminal (e.g. the source terminal) coupled to a reference voltage, i.e. the ground voltage Vgnd. In addition, in some embodiments, the threshold voltage of the transistor M2 is larger than the threshold voltage of the transistor M3. According to some embodiments, the transistor M2 includes a standard N-channel MOSFET (Metal Oxide Semiconductor Field-effect Transistor) with a non-zero threshold voltage (e.g. 0.7V), and the transistor M3 includes a native N-channel MOSFET with a nearly zero threshold voltage (e.g. 0V). As the native N-channel MOSFET is formed in a lightly-doped substrate, the vertical electric field used to turn on the native N-channel MOSFET is smaller than the vertical electric field of the standard N-channel MOSFET.

When the signal Sc2 is a voltage level higher than the nearly zero threshold voltage, the transistor M3 is turned on. Meanwhile, when the signal Sc1 is a voltage level higher than the non-zero threshold voltage, the transistor M1 is also turned on. Therefore, when the transistor M1 of the photoelectric unit 12_11 is turned on, the biasing current Idc is generated to flow through the transistors M1, M2, and M3. When the signal Sc1 is changed into the ground voltage, the transistor M2 is turned off. In other words, the turning on/off of the biasing circuit 221 is controlled by the transistor M2 instead of the transistor M3. The transistor M3 is used to generate the biasing current Idc. Effectively, this arrangement can reduce the RTS noise of the image sensing system 10 for the reason explained in the following paragraphs.

For a CMOS image sensor, RTS noise is caused by trapped charges in the silicon surface of the channel region of a field-effect transistor. The more charges is trapped, the more RTS noise is induced. Moreover, the charges trapped in the channel region of a native N-channel MOSFET is less than the charges trapped in the channel region of a standard N-channel MOSFET. In other words, when a circuit is implemented by the native N-channel MOSFET, the RTS noise of the circuit is lower than the RTS noise of the counterpart implemented by the standard N-channel MOSFET. In FIG. 2, the biasing current Idc of the biasing circuit 221 is generated by the transistor M3, which is a native N-channel MOSFET. Therefore, the RTS noise in the biasing current Idc is much lower than the RTS noise of a biasing current generated by a standard N-channel MOSFET. Accordingly, the RTS noise of the biasing circuit 221 is considerably reduced, and the noise performance of the sensing signal Ss_1 is improved.

Moreover, using the native N-channel MOSFET to generate the biasing current Idc also has the advantage of shrinking the size of the biasing circuit 221 in comparison to the counterpart that employs the standard N-channel MOSFET to generate the biasing current having the similar noise performance. For an MOSFET, the noise of the MOSFET is inversely proportional to the size of the MOSFET. Accordingly, for the conventional counterpart that uses the standard N-channel MOSFET to generate the biasing current, the size of the standard N-channel MOSFET should be large enough to generate a low noise current. On the contrary, by using the native N-channel MOSFET, the noise of the biasing circuit 221 is considerably reduced, and there is no need to enlarge the size of the biasing circuit 221 to further reduce the noise. Thus, the size of the biasing circuit 221 is smaller than the conventional counterpart.

The dividing circuit 222 comprises a capacitor C1 and a capacitor C2. The capacitor C1 has a terminal coupled to the drain terminal of the transistor M2, and a terminal for outputting the signal Sr. The capacitor C2 has a terminal coupled to the terminal of the capacitor C1, and a terminal for receiving the sampling signal Sp. As the capacitor C1 and the capacitor C2 are connected in series between the sensing signal Ss_1 and the sampling signal Sp, the capacitor C1 and the capacitor C2 are arranged to divide the voltage difference between the sensing signal Ss_1 and the sampling signal Sp in order to generate the signal Sr on a terminal Nr. In other words, the capacitor C1 introduces a voltage drop, and the voltage level of the signal Sr is reduced by the voltage drop of the capacitor C1.

According to some embodiments, the capacitor C1 and the capacitor C2 are Metal-oxide-metal (MOM) capacitors. MOM capacitors are less expensive since MOM capacitors do not require extra mask layers during fabrication. The fabrication of the MOM capacitors can be integrated with the connection fabrication in an integrated circuit (IC). For example, when a MOM capacitor is formed by two copper layers separated by oxide dielectrics, the two copper layers can be fabricated by the existing photo-mask of a semiconductor fabrication process. Hence, no extra photo-mask is required.

The conversion circuit 24 comprises a charging circuit 241, a discharging circuit 242, a loading circuit 243, an inverter 244, and a switching circuit 245. The charging circuit 241 is arranged to generate a charging current Ic in response to the signal Sr. The discharging circuit 242 is arranged to generate a discharging current Id in response to the signal Sr. The loading circuit 243 is arranged to receive the charging current Ic and the discharging current Id, and accordingly generate a loading signal S1. The inverter 244 is arranged to output the digital output signal D_1 in response to the loading signal S1. The switching circuit 245 is arranged to selectively equalize the signal Sr and the loading signal S1 in response to a control signal Sc3. In addition, as the voltage level of the signal Sr is reduced by the dividing circuit 222, the conversion circuit 24 can be implemented by a low-voltage (Low-V) device, such as the core device of the semiconductor device.

When the signal Sc3 turns off the switching circuit 245, the conversion circuit 24 can be regarded as an inverting circuit with the predetermined threshold Vpre. When the signal Sc3 turns on the switching circuit 245, the conversion circuit 24 can be regarded as a negative feedback circuit where its input terminal (i.e. the terminal Nr) is connected to its output terminal N2.

According to some embodiments, the charging circuit 241 comprises a P-channel field-effect transistor M4 and a P-channel field-effect transistor M5. The transistor M4 has a control terminal (e.g. a gate terminal) receiving the signal Sr, and a terminal (e.g. a source terminal) coupled to a reference voltage, i.e. the supply voltage Vdd. The transistor M5 has a control terminal (e.g. a gate terminal) receiving a control signal Sc4, a terminal (e.g. a source terminal) coupled to a terminal (e.g. a drain terminal) of the transistor M4, and a terminal (e.g. a drain terminal) for outputting the charging current Ic.

The transistor M4 and the transistor M5 are configured as a cascoded configuration, in which the transistor M5 is used to control the selection of the charging circuit 241. Specifically, when the signal Sc4 is in the low voltage level (e.g. the ground voltage Vgnd), the charging circuit 241 is selected and activated. When the signal Sc4 is in the high voltage level (e.g. the supply voltage Vdd), the charging circuit 241 is not selected, and is therefore inactivated.

The cascoded transistors M4, M5 can be regarded as a transconductance (i.e. gm) branch of the charging circuit 241. Although there is only one branch of cascoded transistors M4, M5 shown in FIG. 2, this is only for simplicity and is not a limitation of the embodiments. The charging circuit 241 may comprise a plurality of cascoded transconductance branches connected between the supply voltage Vdd and the output terminal N1 in parallel, and the plurality of cascoded transconductance branches is controlled by a plurality of control signals, respectively. Accordingly, the charging current Ic of the charging circuit 241 can be programmed through the selection of the plurality of control signals. In other words, the charging current Ic generated by the charging circuit 241 is a programmable charging current.

The discharging circuit 242 comprises an N-channel field-effect transistor M6 and an N-channel field-effect transistor M7. The transistor M6 has a control terminal (e.g. a gate terminal) receiving the signal Sr, and a terminal (e.g. a source terminal) coupled to a reference voltage, i.e. the ground voltage Vgnd. The transistor M7 has a control terminal (e.g. a gate terminal) receiving a control signal Sc5, a terminal (e.g. a source terminal) coupled to a terminal (e.g. a drain terminal) of the transistor M6, and a terminal (e.g. a drain terminal) for outputting the discharging current Id.

The transistor M6 and the transistor M7 are configured as a cascoded configuration, in which the transistor M7 is used to control the selection of the discharging circuit 242. Specifically, when the signal Sc5 is in the high voltage level (e.g. the supply voltage Vdd), the discharging circuit 242 is selected and activated. When the signal Sc5 is in the low voltage level (e.g. the ground voltage Vgnd), the discharging circuit 242 is not selected, and is therefore inactivated.

The cascoded transistors M6, M7 can be regarded as a transconductance (i.e. gm) branch of the discharging circuit 242. Although there is only one branch of cascoded transistors M6, M7 shown in FIG. 2, this is only for simplicity and is not a limitation of the embodiments. The discharging circuit 242 may comprise a plurality of cascoded transconductance branches connected between the output terminal N1 and the ground voltage Vgnd in parallel, and the plurality of cascoded transconductance branches is controlled by a plurality of control signals, respectively. Accordingly, the discharging current Id of the discharging circuit 242 can be programmed through the selection of the plurality of control signals. In other words, the discharging current Id generated by the discharging circuit 242 is a programmable discharging current.

In addition, according to some embodiments, the transistors of the charging circuit 241 (e.g. the transistors M4, M5) are implemented by the core device of the semiconductor device, and the transistors of the discharging circuit 242 (e.g. the transistors M6, M7) are implemented by the I/O (Input/Output) device of the semiconductor device. Specifically, the core device transistor has a higher transconductance than the I/O device transistor, and the core device transistor can bear a lower cross voltage than the I/O device transistor. In other words, the core device transistor can be regarded as a low-voltage (Low-V) device, and the I/O device transistor can be regarded as a high-voltage (High-V) device. For example, the I/O device transistor can be implemented to have an equivalent gate oxide thickness that is thicker than an equivalent gate oxide thickness of a core device transistor. For another example, the I/O device transistor can be implemented to have a non-high-k gate dielectric, and the core device transistor can be implemented to have a high-k gate dielectric.

The loading circuit 243 comprises a capacitor C1. The capacitor C1 has a terminal coupled to the drain terminal (i.e. N1) of the transistor M5 and the drain terminal of the transistor M7 for generating the loading signal S1, and a terminal coupled to the ground voltage Vgnd. According to some embodiments, the capacitor C1 is an adjustable capacitor. When the output capacitance on the output terminal N1 is adjustable, the bandwidth and the gain of the conversion circuit 24 are also adjustable. The loading circuit 243 may be an adjustable capacitor, an adjustable resistor, or a combination of the above devices.

The switching circuit 245 is a switch. The switch has a control terminal for receiving the signal Sc3, a terminal coupled to the gate terminal (i.e. Nr) of the transistor M4 and the gate terminal of the transistor M6, and a terminal coupled to the drain terminal (i.e. N1) of the transistor M5 and the drain terminal of the transistor M7.

The controlling circuit 16 couples to the sampling circuit 14_1 via a control terminal Nc. The controlling circuit 16 comprises a current generator 161, a capacitor 162, a capacitor 163, a switch 164, a resistor 165, and a switch 166. The current generator 161 is arranged to generate a sourcing current Is to the control terminal Nc. The capacitor 162 has a terminal coupled to the control terminal Nc and a terminal coupled to the ground voltage Vgnd. The capacitor 163 has a terminal coupled to the ground voltage Vgnd. The switch 164 is arranged to selectively couple a terminal of the capacitor 163 to the control terminal Nc in response to a sixth control signal Sc6. The resistor 165 has a terminal coupled to the control terminal Nc and a terminal coupled to the ground voltage Vgnd. The switch 166 is arranged to selectively couple the control terminal Nc to the ground voltage Vgnd in response to a seventh control signal Sc7.

According to some embodiments, the current generator 161 is a P-type current Digital-to-analog converter (DAC). The P-type current DAC is arranged to generate a sourcing current according a digital control signal Scd. Therefore, the P-type current DAC is digitally adjusted by the digital control signal Scd in order to generate the required sourcing current Is. In other words, the current generator 161 is an adjustable current generator for generating the adjustable sourcing current Is. The current generator 161 can be controlled to generate the sourcing current Is or not generate the sourcing current Is. The illustration of the current generator 161 in FIG. 2 is just for simplicity. In practice, a switch may be used to connect to the current generator 161 in series. When the switch is turned on, the current generator 161 is connected to the control terminal Nc. When the switch is turned off, the current generator 161 is disconnected from the control terminal Nc.

The capacitor 162 is an adjustable capacitor having an adjustable capacitance. Similarly, the illustration of the capacitor 162 in FIG. 2 is just for simplicity. In practice, a switch may be used to connect to the capacitor 162 in series. When the switch is turned on, the capacitor 162 is connected to the control terminal Nc. When the switch is turned off, the capacitor 162 is disconnected from the control terminal Nc.

The resistor 165 is an adjustable resistor having an adjustable resistance. Similarly, the illustration of the resistor 165 in FIG. 2 is just for simplicity. In practice, a switch may be used to connect to the resistor 165 in series. When the switch is turned on, the resistor 165 is connected to the control terminal Nc. When the switch is turned off, the resistor 165 is disconnected from the control terminal Nc.

Moreover, according to some embodiments, the capacitor 163 is an off-chip capacitor coupled to the image sensing system 10 via a connecting port Np. However, this is not a limitation of the embodiments. The capacitor 163 may be integrated into the single chip of the image sensing system 10. The capacitor 163 is arranged to provide a predetermined voltage level Vbt. The predetermined voltage level Vbt of the capacitor 163 can be internally charged by the current generator 161. Specifically, when the switch 164 is turned on by the signal Sc6, the current generator 161 in conjunction with the resistor 165 charge the capacitor 163 until the voltage drop of the capacitor 163 reaches the predetermined voltage level Vbt. The predetermined voltage level Vbt of the capacitor 163 can also be externally charged/turned by an external circuit.

Figure 3:
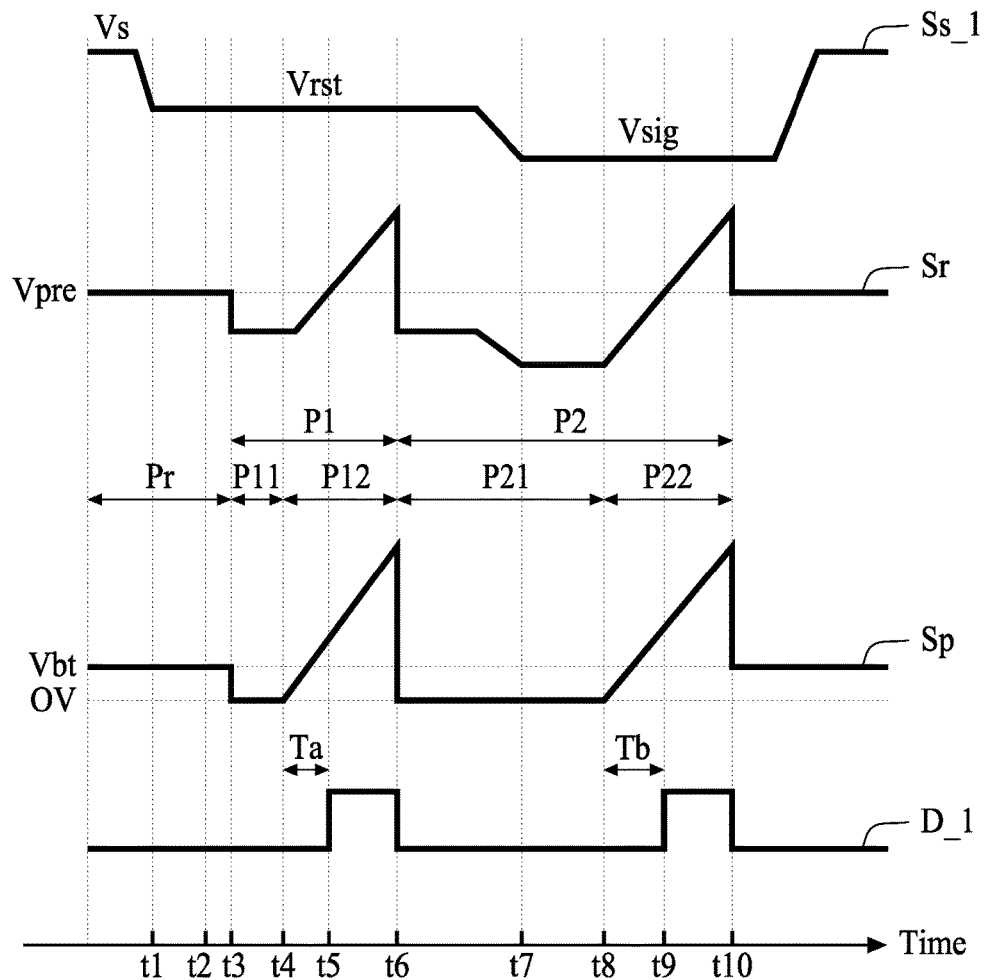
FIG. 3 is a timing diagram illustrating a sensing signal, a signal, a sampling signal, and a digital output signal for circuit operation in FIG. 2 in accordance with some embodiments.

The sensing operation of the sensing device 20 is illustrated in FIG. 3. FIG. 3 is a timing diagram illustrating the sensing signal Ss_1, the signal Sr, the sampling signal Sp, and the digital output signal D_1 in accordance with some embodiments. The sensing operation can be divided into three phases, i.e. a resetting phase Pr, a first sampling phase P1, and a second sampling phase P2. This is not a limitation of the embodiments.

Figure 4:
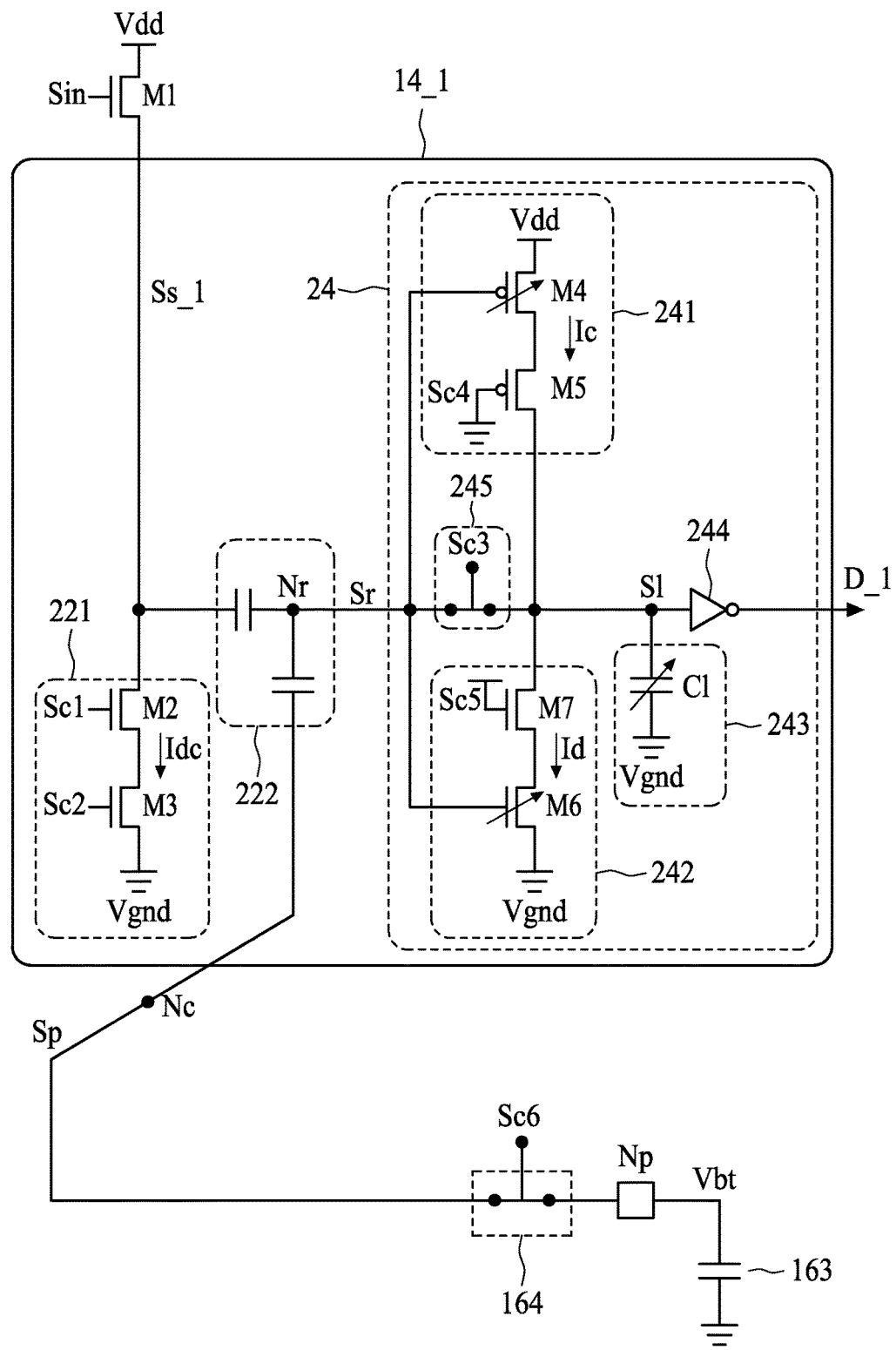
FIG. 4 is a diagram illustrating an equivalent circuit of a sensing device in FIG. 2 during a resetting phase in accordance with some embodiments.

During the resetting phase Pr, the signal Sc1 and the signal Sc2 are the high voltage levels, such as the supply voltage Vdd. The signal Sc4 is the ground voltage Vgnd and the signal Sc5 is the supply voltage Vdd for enabling the conversion circuit 24. The signal Sc3 turns on the switching circuit 245 to equalize the signal Sr and the loading signal S1 such that the signal Sr and the loading signal S1 are equal to the predetermined threshold Vpre. The signal Sc6 turns on the switch 164 to provide the predetermined voltage level Vbt to the control terminal Nc. The signal Sc7 turns off the switch 166. The current generator 161 does not provide the sourcing current Is. The capacitor 162 and the resistor 165 are controlled to substantially disconnect from the control terminal Nc. For example, the current generator 161 is turned off, and the capacitor 162 and the resistor 165 are adjusted to having large impedance during the resetting phase Pr. FIG. 4 is a diagram illustrating the equivalent circuit of the sensing device 20 during the resetting phase Pr in accordance with some embodiments.

In addition, as shown in FIG. 3, the voltage level of the sensing signal Ss_1 (similar to the incoming signal Sin) is controlled to drop to a reset voltage level Vrst from a standby voltage level Vs at time t1 of the resetting phase Pr for resetting the sensing device 14_1. After the sensing device 14_1 is reset, the voltage level of the signal Sr is the predetermined threshold Vpre. Then, the signal Sc3 turns off the switching circuit 245 at time t2, for example, to make the input terminal (i.e. Nr) of the conversion circuit 24 float and to make the loading signal S1 be at a meta-stable state. In other words, after the sensing device 14_1 is reset, the voltage level on the input terminal Nr of the conversion circuit 24 floats on a threshold voltage level, i.e. the predetermined threshold Vpre. If the voltage level on the input terminal Nr of the conversion circuit 24 is varied to higher than the predetermined threshold Vpre, the voltage level of the loading signal S1 is discharged to the ground voltage Vgnd and the digital output signal D_1 becomes the high voltage level. If the voltage level on the input terminal Nr of the conversion circuit 24 is varied to lower than the predetermined threshold Vpre, the voltage level of the loading signal S1 is charged to the supply voltage Vdd and the digital output signal D_1 becomes the low voltage level. As the conversion circuit 24 is configured as an inverter configuration, the predetermined threshold Vpre of the conversion circuit 24 is a fixed voltage level, and the predetermined threshold Vpre is not dependent on the signal Sr of the conversion circuit 24.

Then, the sensing device 20 enters the phase P1. The signal Sc3 is not limited to turn off the switching circuit 245 in the resetting phase Pr, and the signal Sc3 may turn off the switching circuit 245 in the phase P1.

Figure 5:
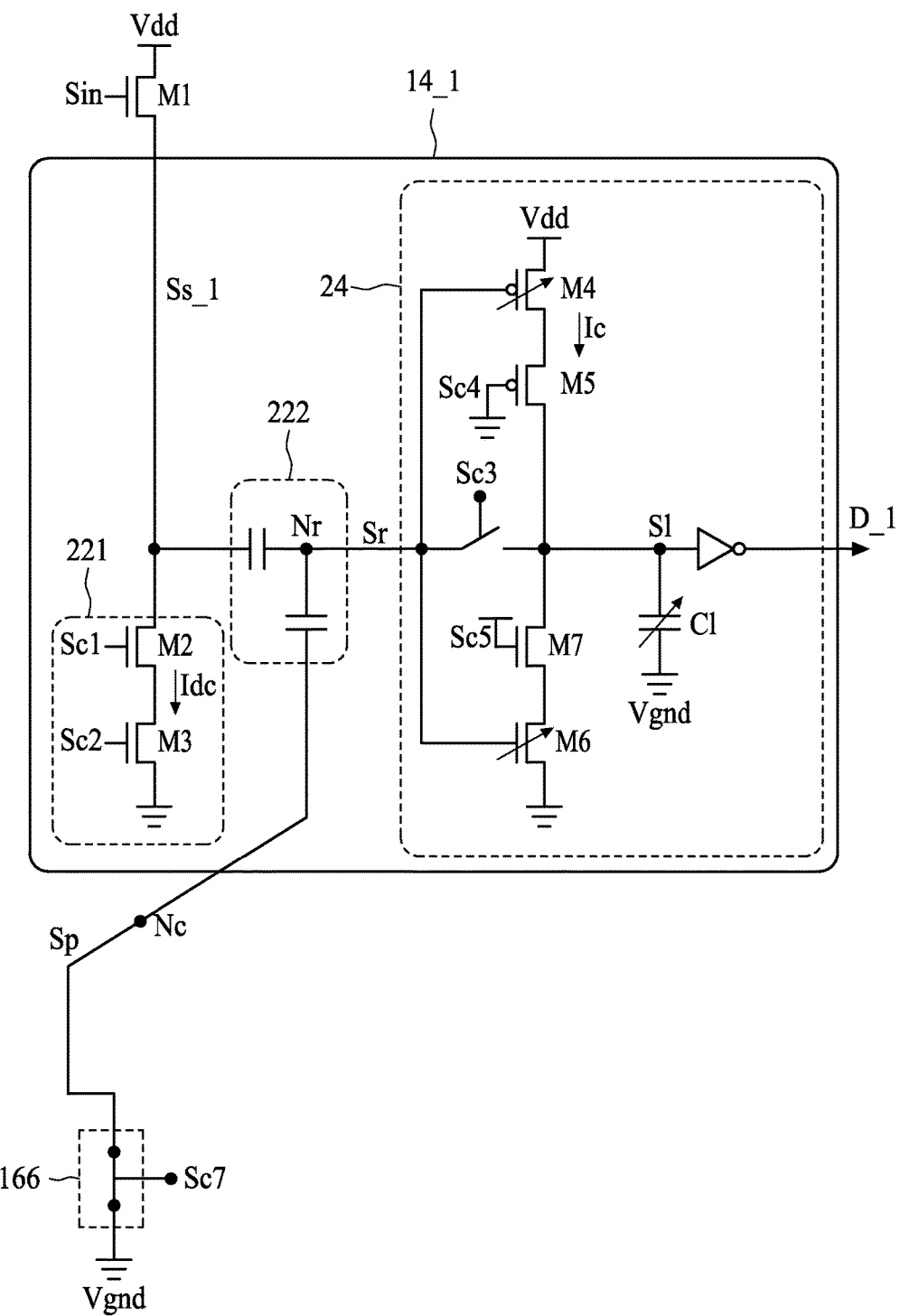
FIG. 5 is a diagram illustrating an equivalent circuit of the sensing device in FIG. 2 during a first sub-phase in the first sampling phase in accordance with some embodiments.

During the phase P1, the operation of the sensing device 20 is divided into two sub-phases P11, P12, wherein the first sub-phase P11 is from time t3 to time t4, and the second sub-phase P12 is from time t4 to time t6. During the sub-phase P11, the signal Sc6 turns off the switch 164 to disconnect the control terminal Nc from the capacitor 163. The signal Sc7 turns on the switch 166 to change the voltage level of the sampling signal Sp to the ground voltage Vgnd. FIG. 5 is a diagram illustrating the equivalent circuit of the sensing device 20 during the sub-phase P11 in the phase P1 in accordance with some embodiments.

When the voltage level of the sampling signal Sp drops to the ground voltage Vgnd, the voltage level of the signal Sr on the terminal Nr also drops a corresponding voltage due to the dividing circuit 222. The dropping of the voltage level of the sampling signal Sp is to make sure the input voltage (i.e. the voltage level of the signal Sr) of the conversion circuit 24 is lower than the predetermined threshold Vpre of the conversion circuit 24. When the voltage level of the signal Sr is lower than the predetermined threshold Vpre, the voltage level of the loading signal S1 is charged to the high voltage level and the voltage level of the digital output signal D_1 is guaranteed to be the low voltage level (e.g. 0V) during the sub-phase P11 in the phase P1.

Figure 6:
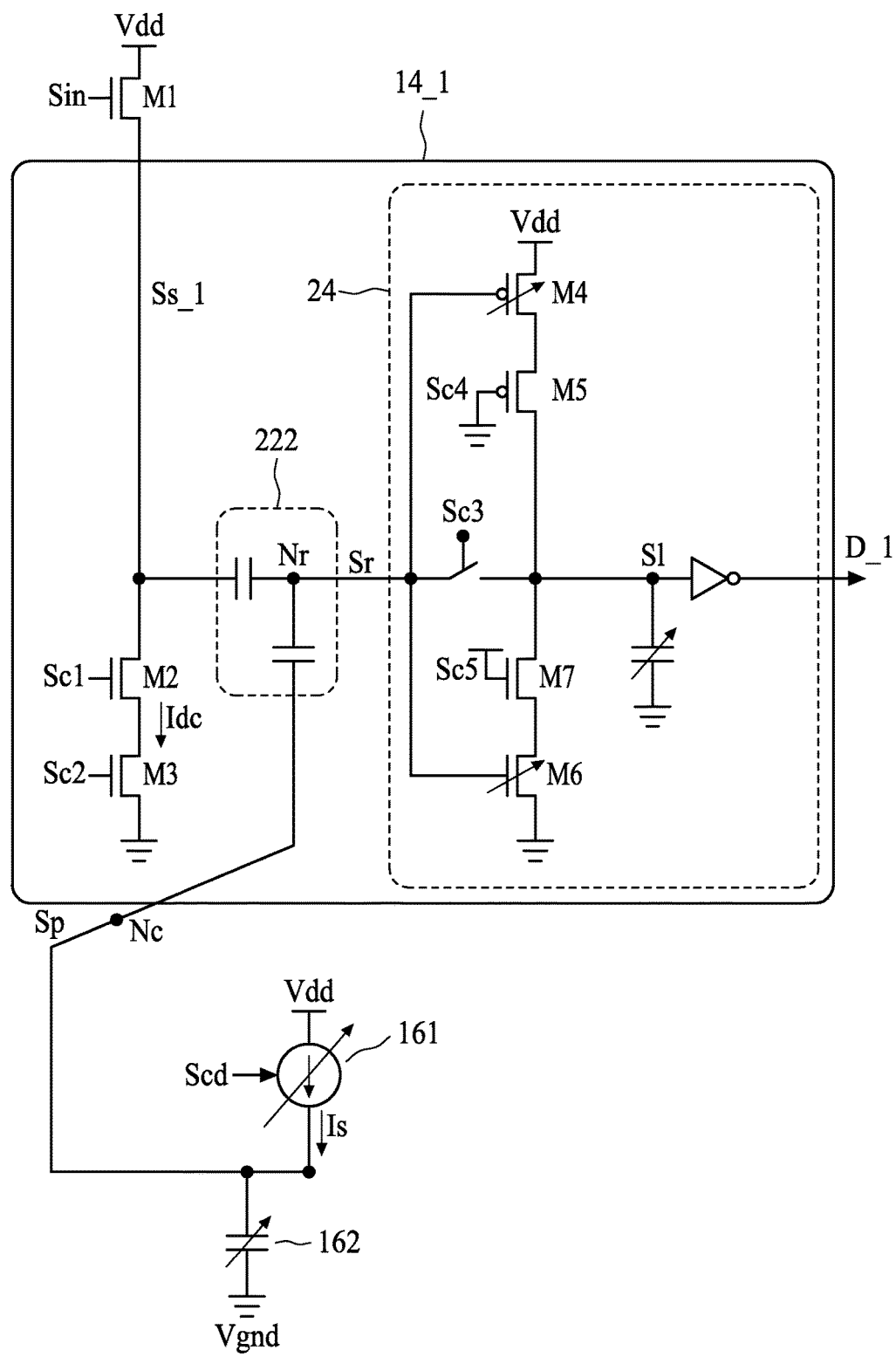
FIG. 6 is a diagram illustrating an equivalent circuit of the sensing device in FIG. 2 during a second sub-phase in the first sampling phase in accordance with some embodiments.

During the sub-phase P12, the signal Sc6 turns off the switch 164. The signal Sc7 turns off the switch 166. The current generator 161 is arranged to charge the capacitors (i.e. the capacitor 162 and the capacitor C2) on the control terminal Nc by the sourcing current Is at time t4 such that the voltage level of the sampling signal Sp ramp-ups with a positive-slope. The resistor 165 is controlled to disconnect from the control terminal Nc during the sub-phase P12 of the phase P1. FIG. 6 is a diagram illustrating the equivalent circuit of the sensing device 20 during the sub-phase P12 in the phase P1 in accordance with some embodiments.

When the voltage level of the sampling signal Sp ramp-ups with the positive-slope, the voltage level of the signal Sr also ramp-ups with a positive-slope, which may be different from the positive-slope of the sampling signal Sp. When the voltage level of the signal Sr reaches the predetermined threshold Vpre of the conversion circuit 24, i.e. at time t5, the conversion circuit 24 flips to discharge the voltage level of the loading signal S1 to the low voltage level. Accordingly, the voltage level of the digital output signal D_1 is changed into the high voltage level (e.g. Vdd) from the low voltage level (e.g. 0V) at time t5.

When the voltage level of the digital output signal D_1 is changed into the high voltage level from the low voltage level, the counter (not shown) connected to the output of the inverter 244 is arranged to count for the time interval Ta between time t4 and time t5. The time interval Ta is then stored in the processor (not shown) for later application.

After time t5, the current generator 161 continues charging the capacitors on the control terminal Nc by the sourcing current Is until time t5. The charging time interval (i.e. from t4 to t6) is a predetermined time interval. When the charging time interval is up, the current generator 161 stops and the signal Sc7 turns on the switch 166 such that the voltage level of the sampling signal Sp goes back to the ground voltage Vgnd again. Meanwhile, the voltage level of the digital output signal D_1 is changed to the low voltage level from the high voltage level at time t6.

After time t6, the sensing device 20 enters the phase P2. The phase P2 is divided into two sub-phases P21, P22, wherein the first sub-phase P21 is from time t6 to time t8, and the sub-phase P22 is from time t8 to time t10. During the sub-phase P21, the photoelectric unit 12_11 is arranged to generate the sensing signal Ss_1 corresponding to the incident light. Specifically, the voltage level of the sensing signal Ss_1 drops a voltage level in order to reach the voltage level Vsig corresponding to the intensity of the incident light. Meanwhile, the signal Sr also drops a corresponding voltage level at time t7 as shown in FIG. 3. The equivalent circuit of the sensing device 20 during the sub-phase P21 of the phase P2 is similar to the equivalent circuit as shown in FIG. 5.

At time t8, the sensing device 20 enters the sub-phase P22. During the sub-phase P22, the signal Sc6 turns off the switch 164. The signal Sc7 turns off the switch 166. The current generator 161 is arranged to charge the capacitors (i.e. the capacitor 162 and the capacitor C2) on the control terminal Nc by the sourcing current Is such that the voltage level of the sampling signal Sp ramp-ups with a positive-slope. The magnitude of the sourcing current Is during the sub-phase P12 is substantially equal to the magnitude of the sourcing current Is during the sub-phase P22 such that the sampling signal Sp can have the same positive-slope. Moreover, the resistor 165 is controlled to disconnect from the control terminal Nc during the sub-phase P22 of the phase P2. The equivalent circuit of the sensing device 20 during the sub-phase P22 of the phase P2 is similar to the equivalent circuit as shown in FIG. 6.

When the voltage level of the sampling signal Sp ramp-ups with the positive-slope, the voltage level of the signal Sr also ramp-ups with a positive-slope, which may be different from the positive-slope of the sampling signal Sp. When the voltage level of the signal Sr reaches the predetermined threshold Vpre of the conversion circuit 24, i.e. at time t9, the conversion circuit 24 flips to discharge the voltage level of the loading signal S1 to the low voltage level. Accordingly, the voltage level of the digital output signal D_1 is changed into the high voltage level (e.g. Vdd) from the low voltage level (e.g. 0V) at time t9.

When the voltage level of the digital output signal D_1 is changed into the high voltage level from the low voltage level, the counter (not shown) connected to the output of the inverter 244 is arranged to count for the time interval Tb between time t8 and time t9. The time interval Tb and the previously obtained time interval Ta are processed by the processor (not shown) in order to determine the intensity of the incident light. Specifically, the processor subtracts the time interval Ta from the time interval Tb to cancel the offset and noise of the sensing device 14_1 such that a clean digitized value corresponding to the intensity of the incident light is obtained. The phase P1 and the phase P2 can be regarded as a correlated-double sampling (CDS) process of the sensing device 14_1.

After time t9, the current generator 161 continues charging the capacitors on the control terminal Nc by the sourcing current Is until time t10. The charging time interval (i.e. from t8 to t10) is a predetermined time interval. When the charging time interval is up, the current generator 161 stops the sourcing current Is. Meanwhile, the signal Sc6 turns on the switch 164 and the signal Sc3 turns on the switching circuit 245. Then, after time t10, the sensing device 20 enters the resetting phase Pr again as shown in FIG. 3.

According to the above-mentioned operation of the sensing device 14_1, the flip-point of the conversion circuit 24 during the phase P1 and the phase P2 is kept on a constant voltage level (i.e. the predetermined threshold Vpre), which is not varied by the voltage level of the sensing signal Ss_1. As the flip-point of the conversion circuit 24 is not affected by the sensing signal Ss_1, the sensing device 14_1 can reduce the column fixed pattern noise (CFPN) of the sensing signal Ss_1.

Moreover, the conversion circuit 24 can be regarded as an inverter type comparator having a flip-point of the predetermined threshold Vpre. The conversion circuit 24 only consumes power when both the charging circuit 241 and the discharging circuit 242 are turned on. This situation occurs when the conversion circuit 24 is in the meta-stable state or in the switching operation. As described above, the switching operation (i.e. t5, t6, t9, and t10) is a very short time in the phase P1 and the phase P2. Therefore, the conversion circuit 24 consumes a very low amount of power during the sensing operation. In addition, as the charging current Ic and the discharging current Id only exist in a very short time during the phase P1 and the phase P2, the RTS noise of the conversion circuit 24 can be reduced.

Figure 7:
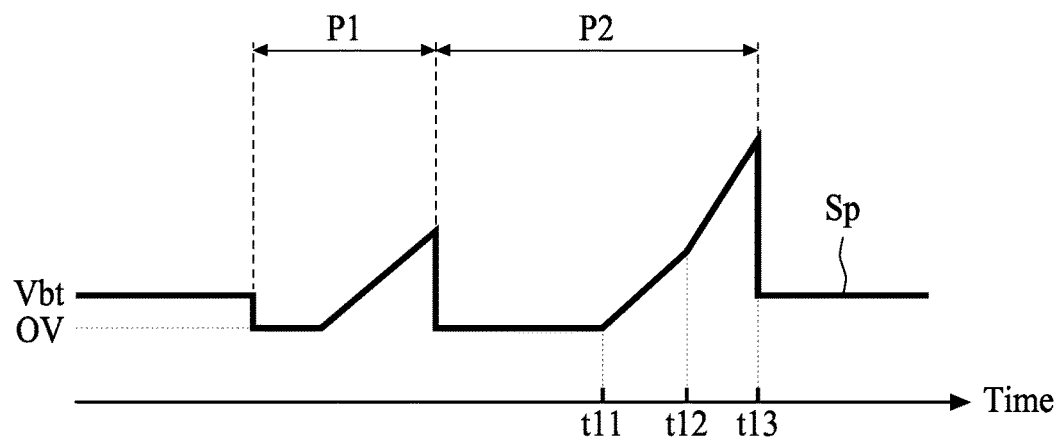
FIG. 7 is a timing diagram illustrating the sampling signal in the sensing device of FIG. 2 having a ramp-up waveform with two different slopes in accordance with some embodiments.

Moreover, as the current generator 161 is capable of generating a different sourcing current Is in response to the digital control signal Scd, the slope of the ramp-up waveform of the sampling signal Sp can be arbitrary controlled by the digital control signal Scd. For example, to realize the sampling of a high dynamic range (HDR) image, the ramp-up waveform of the sampling signal Sp during the sub-phase P22 of the phase P2 can be designed to have multi-slopes in response to the digital control signal Scd. FIG. 7 is a timing diagram illustrating the sampling signal Sp having a ramp-up waveform with two different slopes in accordance with some embodiments. According to some embodiments, the sub-phase P22 of the phase P2 is in the time interval from time t11 to time t13. In the time interval from time t11 to time t12, the digital control signal Scd controls the current generator 161 to generate a smaller sourcing current Is for charging the capacitor 162. In the time interval from time t12 to time t13, the digital control signal Scd controls the current generator 161 to generate a larger sourcing current Is for charging the capacitor 162. Accordingly, the slope of a ramp-up waveform of the sampling signal Sp from time t12 to time t13 is larger than the slope of a ramp-up waveform of the sampling signal Sp from time t11 to time t12.

The ramp-up waveform of the sampling signal Sp in FIG. 7 can also be obtained by generating an increasing step waveform of the sourcing current Is to flow through the resistor 165 with a fixed resistance in response to the digital control signal Scd. In this way, the waveform of the sampling signal Sp from time t11 to time t12 and from time t12 to time t13 are two increasing step waveforms, wherein the equivalent slope of the ramp-up waveform from time t12 to time t13 is larger than the equivalent slope of the ramp-up waveform from time t11 to time t12. Accordingly, as long as the sampling waveform used in the phase P1 and the phase P2 is a monotonic waveform increasing from a low voltage level to a high voltage level, the sampling waveform falls within the scope of the embodiments.

Figure 8:
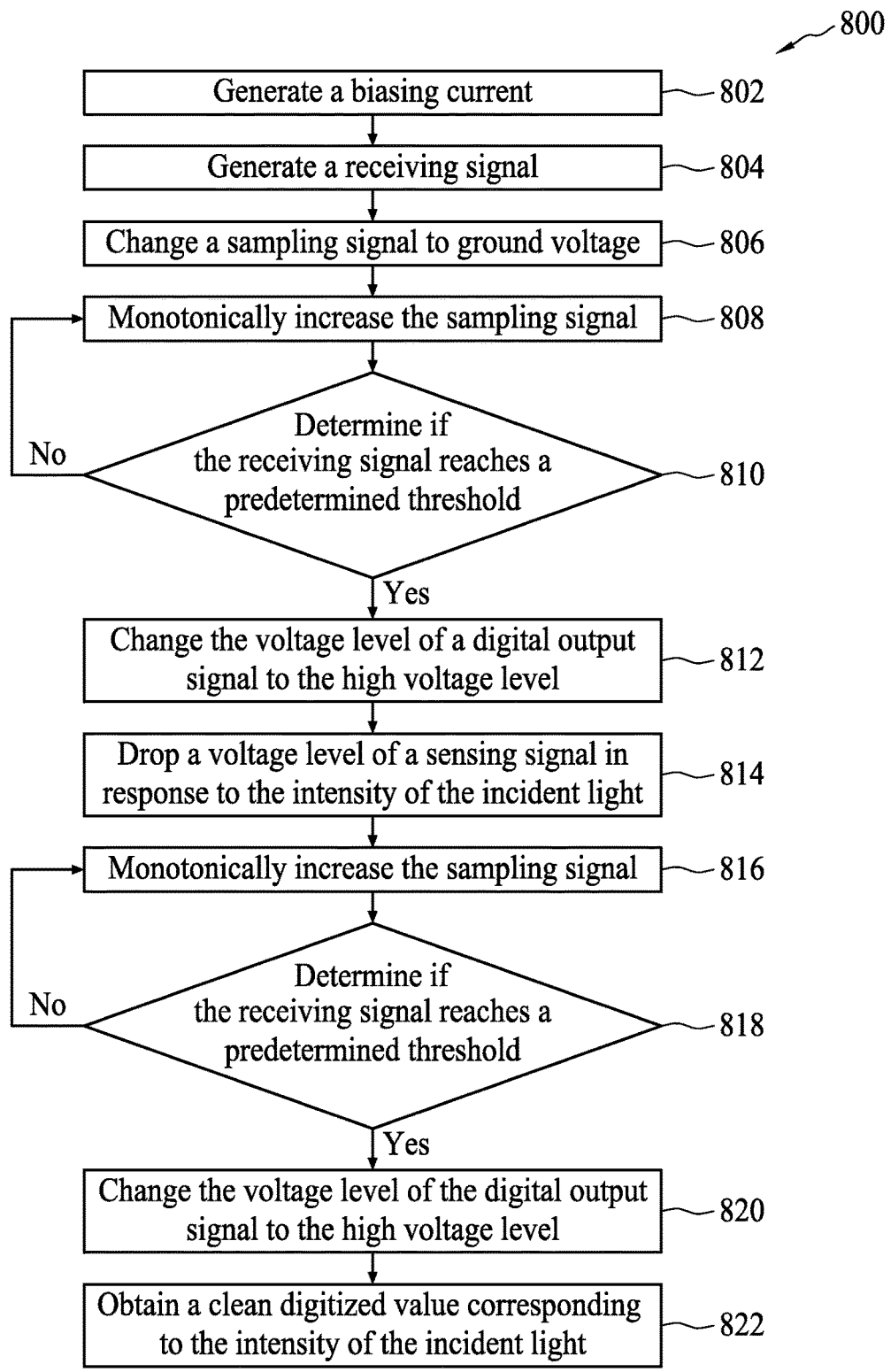
FIG. 8 is a flow diagram illustrating a signal sensing method in accordance with some embodiments.

FIG. 8 is a flow diagram illustrating a signal sensing method 800 in accordance with some embodiments. The signal sensing method 800 is capable of sensing a pixel signal of a sensor array. For example, the signal sensing method 800 can be applied in the above image sensing system 10 for sensing the image signal generated by the plurality of photoelectric units 12_MN of the sensor array 12. For brevity, the signal sensing method 800 is described in conjunction with the image sensing system 10. Referring to FIG. 8, in operation 802, the biasing current Idc is provided for the sensing signal Ss_1. The biasing current Idc is generated by at least a native N-channel MOSFET.

In operation 804, a voltage difference between the sensing signal Ss_1 and the sampling signal Sp with the predetermined voltage level Vbt is divided for generating the signal Sr.

In operation 806, the sampling signal Sp is controlled to change into a reference voltage from the predetermined voltage level Vbt. According to some embodiments, the reference voltage is the ground voltage Vgnd.

In operation 808, the sampling signal Sp is controlled to monotonically increase from the ground voltage Vgnd. According to some embodiments, the monotonically increasing waveform is a ramp waveform with a positive-slope.

In operation 810, it is determined if the voltage level of the signal Sr reaches the predetermined threshold Vpre. If the voltage level of the signal Sr reaches the predetermined threshold Vpre, the signal sensing method 800 goes to operation 812. If the voltage level of the signal Sr does not reach the predetermined threshold Vpre, the signal sensing method 800 goes to operation 810 to continue increasing the voltage of the sampling signal Sp. The operation 810 can be performed by the conversion circuit 24.

In operation 812, the time interval Ta (i.e. from time t4 to time t5) to reach the predetermined threshold Vpre is detected. When the voltage level of the signal Sr reaches the predetermined threshold Vpre, the voltage level of the digital output signal D_1 is changed to the high voltage level from the low voltage level.

In operation 814, the voltage level of the sensing signal Ss_1 drops a voltage level to reach the voltage level Vsig in response to the intensity of the incident light.

In operation 816, the sampling signal Sp is controlled to monotonically increase from the ground voltage Vgnd. According to some embodiments, the monotonically increasing waveform is a ramp waveform with a positive-slope.

In operation 818, it is determined if the voltage level of the signal Sr reaches the predetermined threshold Vpre. If the voltage level of the signal Sr reaches the predetermined threshold Vpre, the signal sensing method 800 goes to operation 820. If the voltage level of the signal Sr does not reach the predetermined threshold Vpre, the signal sensing method 800 goes to operation 816 to continue increasing the voltage of the sampling signal Sp. The operation 818 can be performed by the conversion circuit 24.

In operation 820, the time interval Tb (i.e. from time t8 to time t9) to reach the predetermined threshold Vpre is detected. When the voltage level of the signal Sr reaches the predetermined threshold Vpre, the voltage level of the digital output signal D_1 is changed to the high voltage level from the low voltage level.

In operation 822, a clean digitized value corresponding to the intensity of the incident light is obtained according to the difference in time between the time interval Ta and the time interval Tb.

Briefly, the controlling circuit 16 is controlled to generate a multi-slope ramp-up signal in order to sample the plurality of sensing signals Ss_1-Ss_M. For each sensing device of the plurality of sensing devices 14_1-14_M, the sensing device comprises a native N-channel MOSFET to generate the biasing current. The native N-channel MOSFET biasing circuit occupies a small area and has a low RTS noise. The sensing device further comprises a capacitor dividing circuit for dividing the sensing signal in order to generate the signal Sr. The capacitor dividing circuit is capable of decoupling the high voltage of the sensing signal in order to generate a low voltage signal Sr. The sensing device further comprises an inverter type comparator having a constant flip-point in order to detect the voltage level of the sensing signal. As the constant flip-point is not dependent on the sensing signal, the sensing device can reduce the column fixed pattern noise (CFPN) of the sensing signal. Moreover, the inverter type comparator also has a low RTS noise. Therefore, the image sensing system 10 is a low power, low noise, small area, and high performance CIS (CMOS image sensor).

In some embodiments of the present disclosure, a sensing device includes a sampling circuit and a conversion circuit. The sampling circuit is arranged to sample a sensing signal for generating a signal in response to a sampling signal having a monotonically increasing waveform. The conversion circuit is arranged to convert the signal into a digital output signal when the signal reaches a predetermined threshold of the conversion circuit.

In some embodiments of the present disclosure, an image sensing system includes a plurality of photoelectric units and a plurality of sensing devices. The plurality of photoelectric units is arranged to generate a plurality of sensing signals. Each sensing device is coupled to a predetermined number of the plurality of photoelectric units. Each sensing device comprises a sampling circuit and a conversion circuit. The sampling circuit is arranged to sample a sensing signal generated by a photoelectric unit selected from the predetermined number of the plurality of photoelectric units for generating a signal in response to a sampling signal having a monotonically increasing waveform. The conversion circuit is arranged to convert the signal into a digital output signal when the signal reaches a predetermined threshold of the conversion circuit.

In some embodiments of the present disclosure, a signal sensing method includes: generating a sampling signal having a monotonically increasing waveform; sampling a sensing signal for generating a signal in response to the sampling signal; and converting the signal into a digital output signal when the signal reaches a predetermined threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensing device, comprising:
 a sampling circuit, arranged to sample a sensing signal for generating a signal in response to a sampling signal having a monotonically increasing waveform; and
 a conversion circuit, arranged to convert the signal into a digital output signal when the signal reaches a predetermined threshold of the conversion circuit.

2. The sensing device of claim 1, wherein the sampling circuit comprises:
 a biasing circuit, arranged to provide a biasing current for the sensing signal; and
 a dividing circuit, coupled to the biasing circuit for dividing a voltage difference between the sensing signal and the sampling signal to generate the signal.

3. The sensing device of claim 2, wherein the biasing circuit comprises:
 a first N-channel field-effect transistor, having a control terminal for receiving a first control signal, and a first terminal for receiving the sensing signal; and
 a second N-channel field-effect transistor, having a control terminal for receiving a second control signal, a first terminal coupled to a second terminal of the first field-effect transistor, and a second terminal coupled to a reference voltage;
 wherein the second N-channel field-effect transistor is a native N-channel field-effect transistor, and a first threshold voltage of the first N-channel field-effect transistor is larger than a second threshold voltage of the second N-channel field-effect transistor.

4. The sensing device of claim 2, wherein the dividing circuit comprises:
 a first capacitor, having a first terminal coupled to the first terminal of the first N-channel field-effect transistor, and a second terminal for outputting the signal; and
 a second capacitor, having a first terminal coupled to the second terminal of the first capacitor, and a second terminal for receiving the sampling signal.

5. The sensing device of claim 1, wherein the conversion circuit comprises:
 a charging circuit, arranged to generate a charging current in response to the signal;
 a discharging circuit, arranged to generate a discharging current in response to the signal;
 a loading circuit, arranged to receive the charging current and the discharging current, and accordingly generate a loading signal;
 an inverter, arranged to output the digital output signal in response to the loading signal; and
 a switching circuit, arranged to selectively equalize the signal and the loading signal in response to a first control signal.

6. The sensing device of claim 5, wherein when the first control signal turns on the switching circuit to equalize the signal and the loading signal, the signal and the loading signal are to equal the predetermined threshold; and when the first control signal turns off the switching circuit and the monotonically increasing waveform of the sampling signal causes the signal to reach the predetermined threshold, the inverter converts the digital output signal from a first voltage level into a second voltage level different from the first voltage level.

7. The sensing device of claim 5, wherein the charging circuit comprises:
 a first P-channel field-effect transistor, having a control terminal receiving the signal, and a first terminal coupled to a first reference voltage; and
 a second P-channel field-effect transistor, having a control terminal receiving a second control signal, a first terminal coupled to a second terminal of the first P-channel field-effect transistor, and a second terminal for outputting the charging current;
 the discharging circuit comprises:
 a first N-channel field-effect transistor, having a control terminal receiving the signal, and a first terminal coupled to a second reference voltage different from the first reference voltage; and
 a second N-channel field-effect transistor, having a control terminal receiving a third control signal different from the second control signal, a first terminal coupled to a second terminal of the first N-channel field-effect transistor, and a second terminal for outputting the discharging current;

the loading circuit comprises:

a capacitor, having a first terminal coupled to the second terminal of the second P-channel field-effect transistor and the second terminal of the second N-channel field-effect transistor for generating the loading signal, and a second terminal coupled to the second reference voltage; and the switching circuit comprises:

a switch, having a control terminal for receiving the first control signal, a first terminal coupled to the control terminal of the first P-channel field-effect transistor and the control terminal of the first N-channel field-effect transistor, and a second terminal coupled to the second terminal of the second P-channel field-effect transistor and the second terminal of the second N-channel field-effect transistor.

8. The sensing device of claim 1, further comprising:

a controlling circuit, arranged to generate the sampling signal, wherein the controlling circuit couples to the sampling circuit via a control terminal, and the controlling circuit comprises:

a current generator, arranged to generate a sourcing current to the control terminal;

a first capacitor, having a first terminal coupled to the control terminal and a second terminal coupled to a reference voltage;

a second capacitor, having a first terminal coupled to the reference voltage;

a first switch, arranged to selectively couple a second terminal of the second capacitor to the control terminal in response to a first control signal;

a resistor, having a first terminal coupled to the control terminal and a second terminal coupled to the reference voltage; and a second switch, arranged to selectively couple the control terminal to the reference voltage in response to a second control signal.

9. The sensing device of claim 8, wherein the sourcing current charges the second capacitor into a predetermined voltage level when the first control signal turns on the first switch and the second control signal turns off the second switch.

10. The sensing device of claim 8, wherein during a first sampling phase, the first control signal turns on the first switch and the second control signal turns off the second switch, then the first control signal turns off the first switch and the second control signal turns on the second switch, and then the first control signal and the second control signal turn off the first switch and the second switch, respectively, for generating the monotonically increasing waveform on the control terminal in response to the sourcing current; and during a second sampling phase following the first sampling phase, the first control signal turns off the first switch and the second control signal turns on the second switch, and then the first control signal and the second control signal turn off the first switch and the second switch respectively for generating the monotonically increasing waveform on the control terminal in response to the sourcing current.

11. An image sensing system, comprising:

a plurality of photoelectric units, arranged to generate a plurality of sensing signals; and a plurality of sensing devices, each sensing device coupled to a predetermined number of the plurality of photoelectric units;

wherein each sensing device comprises:

a sampling circuit, arranged to sample a sensing signal generated by a photoelectric unit selected from the predetermined number of the plurality of photoelectric units for generating a signal in response to a sampling signal having a monotonically increasing waveform; and a conversion circuit, arranged to convert the signal into a digital output signal when the signal reaches a predetermined threshold of the conversion circuit.

12. The image sensing system of claim 11, wherein the sampling circuit comprises:

a biasing circuit, arranged to provide a biasing current for the sensing signal; and a dividing circuit, coupled to the biasing circuit for dividing a voltage difference between the sensing signal and the sampling signal to generate the signal.

13. The image sensing system of claim 11, wherein the conversion circuit comprises:

a charging circuit, arranged to generate a charging current in response to the signal;

a discharging circuit, arranged to generate a discharging current in response to the signal;

a loading circuit, arranged to receive the charging current and the discharging current, and accordingly generate a loading signal;

an inverter, arranged to output the digital output signal in response to the loading signal; and a switching circuit, arranged to selectively equalize the signal and the loading signal in response to a first control signal.

14. The image sensing system of claim 13, wherein when the first control signal turns on the switching circuit to equalize the signal and the loading signal, the signal and the loading signal are equal to the predetermined threshold; and when the first control signal turns off the switching circuit and the monotonically increasing waveform of the sampling signal causes the signal to reach the predetermined threshold, the inverter converts the digital output signal from a first voltage level into a second voltage level different from the first voltage level.

15. The image sensing system of claim 11, further comprising:

a controlling circuit, coupled to the plurality of sensing devices for generating the sampling signal, wherein the controlling circuit couples to the plurality of sampling circuits via a control terminal, and the controlling circuit comprises:

a current generator, arranged to generate a sourcing current to the control terminal;

a first capacitor, having a first terminal coupled to the control terminal and a second terminal coupled to a reference voltage;

a second capacitor, having a first terminal coupled to the reference voltage;

a first switch, arranged to selectively couple a second terminal of the second capacitor to the control terminal in response to a first control signal;

a resistor, having a first terminal coupled to the control terminal and a second terminal coupled to the reference voltage; and a second switch, arranged to selectively couple the control terminal to the reference voltage in response to a second control signal.

16. The image sensing system of claim 15, wherein during a first sampling phase, the first control signal turns on the first switch and the second control signal turns off the second switch, then the first control signal turns off the first switch and the second control signal turns on the second switch, and then the first control signal and the second control signal turn off the first switch and the second switch respectively for generating the monotonically increasing waveform on the control terminal in response to the sourcing current; and during a second sampling phase following the first sampling phase, the first control signal turns off the first switch and the second control signal turns on the second switch, and then the first control signal and the second control signal turn off the first switch and the second switch respectively for generating the monotonically increasing waveform on the control terminal in response to the sourcing current.

17. A signal sensing method, comprising:
generating a sampling signal having a monotonically increasing waveform;
sampling a sensing signal for generating a signal in response to the sampling signal; and
converting the signal into a digital output signal when the signal reaches a predetermined threshold.

18. The signal sensing method of claim 17, wherein sampling the sensing signal for generating the signal in response to the sampling signal comprises:
providing a biasing current for the sensing signal; and
dividing a voltage difference between the sensing signal and the sampling signal to generate the signal.

19. The signal sensing method of claim 17, wherein converting the signal into the digital output signal when the signal reaches the predetermined threshold comprises:
generating a charging current in response to the signal;
generating a discharging current in response to the signal;
loading the charging current and the discharging current and accordingly generating a loading signal;
outputting the digital output signal in response to the loading signal;
equalizing the signal and the loading signal to be the predetermined threshold; and
converting the digital output signal from a first voltage level into a second voltage level different from the first voltage level when the signal reaches the predetermined threshold.

20. The signal sensing method of claim 17, wherein generating the sampling signal having a monotonically increasing waveform comprises:
during a first sampling phase:
generating the sampling signal with a predetermined voltage level;
generating the sampling signal with a reference voltage lower than the predetermined voltage level; and
generating the sampling signal with the monotonically increasing waveform;
during a second sampling phase:
generating the sampling signal with the reference voltage; and
generating the sampling signal with the monotonically increasing waveform.

* * * * *